United States Patent [19]

Kinoshita et al.

[11] Patent Number: 4,982,409

[45] Date of Patent: Jan. 1, 1991

[54] SEMICONDUCTOR LASER DEVICE

[75] Inventors: Hideaki Kinoshita, Yokohama; Naohiro Shimada, Kawasaki, both of Japan

[73] Assignee: Kabushiki Kaisha Toshiba, Kawasaki, Japan

[21] Appl. No.: 402,673

[22] Filed: Sep. 5, 1989

[30] Foreign Application Priority Data

Sep. 9, 1988 [JP] Japan ................................ 63-225979

[51] Int. Cl.$^5$ .............................................. H01S 3/19
[52] U.S. Cl. ............................................ 372/45; 372/46
[58] Field of Search .............................. 372/45, 46, 43

[56] References Cited

U.S. PATENT DOCUMENTS 4,635,263  1/1987  Motegi et al. ........................ 362/46
4,757,510  7/1988  Kaneno et al. ....................... 372/45

FOREIGN PATENT DOCUMENTS 0004189  1/1982  Japan .................................... 372/45
0074385  4/1986  Japan .................................... 372/46

OTHER PUBLICATIONS

Kazumura et al., Feasibility of the LPE Growth of $Al_xGa_yIn_{1-x-y}P$ on GaAs Substrates, Japanese Journal of Applied Physics, vol. 22, No. 4, Apr. 1983, pp. 654–657.

Hino et al., High Aluminum Composition AlGaInP Grown by Metalorganic Chemical Vapor Deposition–Impurity Doping and 590 nm (Orange) Electroluminescence, Japanese Journal of Applied Physics, vol. 23, No. 9, Sep. 1984, pp. 2746–2748.

Primary Examiner—Georgia Epps
Attorney, Agent, or Firm—Finnegan, Henderson, Farabow, Garrett, and Dunner

[57] ABSTRACT

A semiconductor laser device comprises a substrate formed of elements of the III–V groups and having one conductivity type, a lower clad layer formed on the substrate and having the same conductivity type as that of the substrate, and an upper clad layer formed on the lower clad layer and having a conductivity type opposite to that of the lower clad layer. A waveguide layer having a large refractive index is formed within the lower clad layer by decreasing the band gap of the upper clad layer. The light generated in an activation layer is guided to the lower clad layer, so as to suppress adverse effects which the upper clad layer may have on element characteristics.

11 Claims, 3 Drawing Sheets

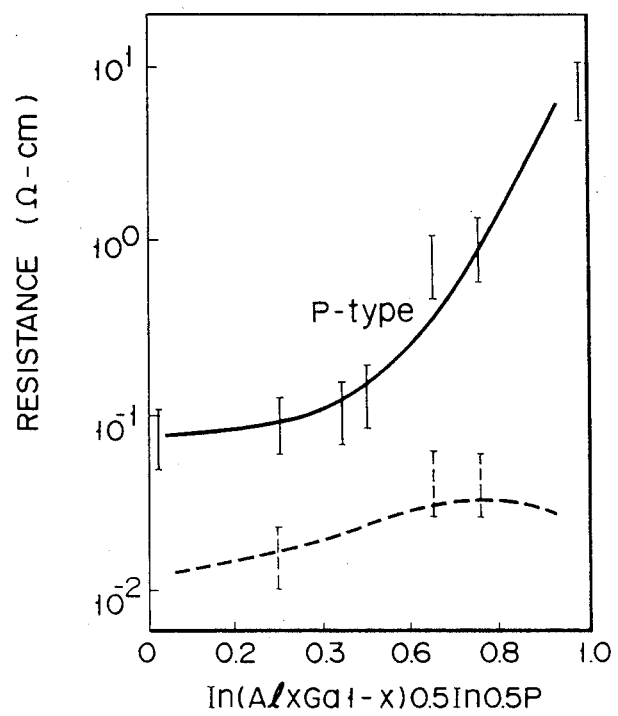
F I G. 2

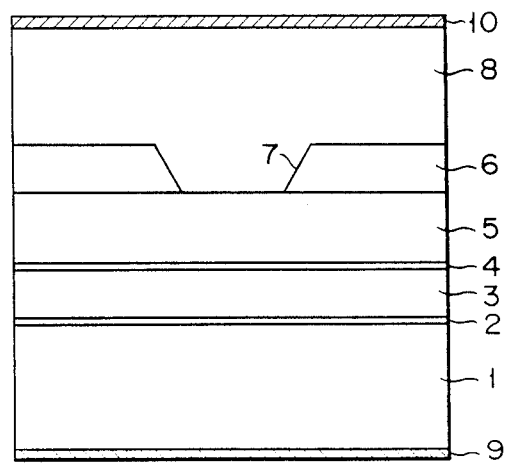
F I G. 3
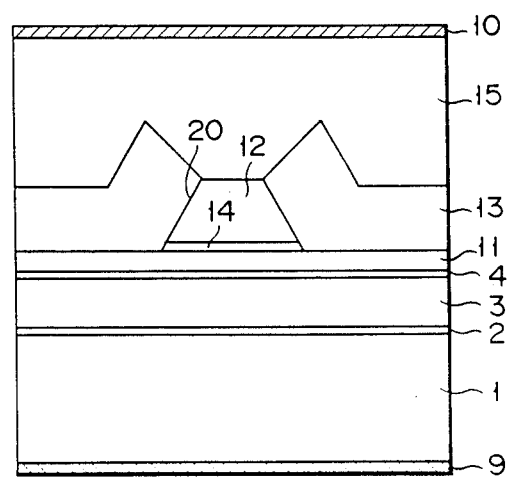
F I G. 4

SEMICONDUCTOR LASER DEVICE

BACKGROUND OF THE INVENTION

1. Field of the Invention

The present invention relates to a semiconductor laser device formed mainly of InGaAlP and used for a short-wavelength band of 580 to 680 μm.

2. Description of the Related Art

Among the semiconductor laser devices formed of the elements belonging to the III to V groups of the periodic table, a double hetero structure semiconductor laser device whose activation layer and clad layer are formed of a four-element mixed crystal of InGaAlP produces the shortest oscillation wavelength. Therefore, in comparison with a currently-adopted GaAlAs-based semiconductor laser device whose wavelength band is between 780 and 830 nm, it is suitable for use in an optical information processor using an optical disk, a laser printer, or a light source for plastic fibers. Moreover, it can be used in a bar code reader, in place of a He-Ne gas ion laser device having its peak at 633.8 nm, or in an optical measurement controller.

In general, an InGaAlP-based semiconductor laser device is manufactured by use of a GaAs substrate. A double hereto laser of InGaAlP is formed on the surface of the GaAs substrate in a manner to achieve lattice matching with the GaAs substrate.

The four-element mixed crystal of InGaAlP is normally expressed as $In_{1-y}(Ga_{1-x}Al_x)_yP$. If y in this formula is nearly equal to 0.5, the mixed crystal achieves lattice matching with respect to the GaAs substrate on the order of less than $\pm 1 \times 10^{-3}$, even if the value of x (i.e., the mixing rate) is arbitrary.

In the case where y=0.5, the band gap energy Eg of the mixed crystal, i.e., $In_{0.5}(Ga_{1-x}Al_x)_{0.5}P$, takes of the value of 1.91 eV to 2.25 eV, provided that $x=0\sim 1$.

M. Kazumura et al., Jpn. Appl. PHYS., 22 654 (1983) shows the relationship between the lattice constant of the mixed crystal of InGaAlP and the energy gap (Eg), with the lattice constant and the energy gap being plotted against the axis of ordinates and the axis of abscissas, respectively.

According to the document, when Eg=2.17 eV, the transition regions for direct transition and indirect transition correspond to the case where the mixing rate x is equal to 0.7. Therefore, a mixing rate x of $0\sim 0.2$ ($\lambda = 580 \sim 680$ nm) is normally used for an activation layer, and a mixing rate x of not less than 0.4 ($x \geq 0.4$) is normally used for a clad layer. The crystal growth of the activation layer and clad layer is performed by use of the MOCVD (metal organic chemical vapor deposition) method, the MBE (molecular beam epitaxy) method, or the like.

FIG. 1 shows a cross section of the main portion of a conventional InGaAlP semiconductor laser device obtained by use of the MOCVD method. This semiconductor laser device is of a gain waveguide type which has a so-called inner stripe (IS) structure, wherein a current blocking layer formed of GaAs is located on the upper side of a double hetero layer formed of InGaAlP.

The above conventional semiconductor laser device is manufactured as follows.

First of all, the following layers are formed on the surface of n-type GaAs substrate 50 by use of the MOCVD method: lower clad layer 51 formed on n-type $In_{0.5}(Ga_{0.5}Al_{0.5})_{0.5}P$; undoped activation layer 52 formed of $In_{0.5}Ga_{0.5}P$; upper of clad layer 53 formed of p-type $In_{0.5}(Ga_{0.5}Al0.5)_{0.5}P$; current supply-facilitating layer 54 formed of p-type $In_{0.5}Ga_{0.5}P$; and current-blocking layer 55 formed of n-type GaAs. The thicknesses of the respective layers are determined as follows: 1 μm for lower clad layer 51; $0.08 \sim 0.1$ μm for undoped activation layer 52; 1 μm for upper clad layer 53; 0.05 μm for current supply-facilitating layer 54; and 0.5 μm for current-blocking layer 55.

As dopants for determining the conductivity type of each layer, Zn and one of Si and Se are used.

The carrier concentration of each layer is as follows: $51 \times 10^{18}$ cm$^{-3}$ for lower clad layer 51; less than $1 \times 10^{16}$ cm$^{-3}$ for undoped activation layer 52; $2 \times 10^{17}$ cm$^{-3}$ for upper clad layer 53; $(2 \sim 8) \times 10^{18}$ cm$^{-3}$ for current supply-facilitating layer 54; and $(1 \sim 2) \times 10^{18}$ cm$^{-3}$ for current-blocking layer 55.

Next, mesa stripe groove 56 is formed in current-blocking layer 55. Thereafter, constant layer 57 formed of p-type GaAs is deposited on the resultant structure by use of the MOCVD method such that contact layer 57 has a thickness of 1 to 3 μm and a carrier concentration of $1 \times 10^{19}$ cm$^{-3}$.

Since there is a large energy difference between the valence bands of InGaAlP and GaAs, current supply-facilitating layer 54 serves to suppress formation of a high-resistance energy barrier at the hereto interface between the p-type regions.

After crystal growth is performed with respect to each layer in the above manner, the surface of GaAs substrate 50 is lapped and specularly polished, while simultaneously adjusting the thickness of GaAs substrate 50 to about 80 μm. Then, ohmic electrodes (not shown), such as Au/Zn (p side) and Au/Ge (n side) are arranged on the exposed surface portions of contact layer 57 and GaAs substrate 50, respectively. Thereafter, GaAs substrate 50 is divided into chips of predetermined shapes, and the p-side of the chip is mounted on a heat sink.

The characteristics of the InGaAlP semiconductor laser device fabricated in the above fashion depend greatly on the p-type dopant doped into the InGaAlP. In general, Zn is most suitable for use as a p-type dopant, in light of controllability and stability. More specifically, in comparison with the case where GaAs or GaAlAs is used, a small amount of Zn is taken into the crystal at the time of vapor phase growth process, such as the vapor phase growth process of the MOCVD method. Further, Zn is hard to activate as a carrier in the crystal. These tendencies will become more marked with an increase in the Al mixing rate x.

FIG. 2 shows how the specific resistance is dependent on the mixing rate x in the case where n-type and p-type impurities are doped into the $In_{0.5}(Ga_{1-x}Al_x)_{0.5}$ deposited on the GaAs substrate by use of the MOCVD crystal growth process. As can be understood from FIG. 2, the p-type InGaAlP has resistance about ten times as high as that of the n-type InGaAlP, and the resistance of the p-type In GaAlP rapidly increases in the range where $x \geq 0.5$ (in which range, the p-type InGaAlP is used as a p-type clad layer of a semiconductor laser device). Therefore, FIG. 2 shows how the specific resistance of the n-type or p-type InGaAlP is dependent on Al. The source of this technical information is I. Hino et al., Jpn. Appl. Phys., 23, No. 9, 1 746 (1984).

Since, as mentioned above, Zn is hard to activate in the crystal, the crystal contain a large amount of Zn which does not function as a carrier. Further, the amount of Zn which taken into the crystal increases with an increase in the mixing rate x. Therefore, most of the Zn becomes defective after taken into the crystal, with the result that both the optical and thermal characteristics of the crystal are adversely affected.

In the above InGaAlP-based semiconductor laser device, the p-type upper clad layer has a decisive effect on the characteristics of the laser device. More specifically, since the upper clad layer has high resistance, the series resistance of the elements is high, necessitating application of high driving voltage. In addition, if the resistance of the upper clad layer is higher than those of the other layers, the region in which current flows expands laterally just below the current-blocking layer. Accordingly, the current introduction into the activation layer requires a large area and cannot be performed without causing a certain degree of loss. As a result, the threshold current and the driving current increase. It should be also noted that the thermal resistance of InGaAlP is higher than those of GaAs and GaAlAs. (The thermal resistance becomes higher with an increase in the Al mixing rate x, and is maximum when Al/Ga=1.) However, since the p-type upper clad layer has a low carrier concentration, its thermal resistance is inevitably higher than that of the n-type lower clad layer.

For the reasons stated above, the thermal radiation of the light-generating region is not good, and therefore the laser characteristics are markedly affected at a high temperature. In addition, since the p-type upper clad layer contains defects caused by the large amount of Zn taken therein, it is likely that the characteristics of the upper clad layer will deteriorate when exposed to light or heat. An element whose characteristics have been deteriorated was actually examined, and the examination showed that the deterioration was due to the defects (such as DLD and DSD) caused in the p-type upper clad layer.

The problems noted above become more serious with an increase in the Al mixing rate x of the p-type upper clad layer. However, if the Al mixing rate is decreased, the carriers may be confined to a limited region, and the light may be liable to leak. Therefore, it becomes necessary to thicken the upper clad layer. In this way, the problems regarding the p-type clad layer cannot be solved even if the mixing rate x is varied.

SUMMARY OF THE INVENTION

Accordingly, an object of the present invention is to provide a semiconductor laser device wherein the upper clad layer does not much affect the characteristics of the laser element.

To achieve this object, the present invention provides a semiconductor laser device which comprises: a GaAs substrate of one conductivity type; a lower clad layer formed on the GaAs substrate, the lower clad layer being formed of a four-element mixed crystal and being of the same conductivity type as that of the GaAs substrate; an upper clad layer formed on the lower clad layer, with an activation layer interposed, the upper clad layer being formed of a four-element mixed crystal and being of the opposite conductivity type to that of the lower clad layer; and an asymmetric double hetero structure defined by the upper and lower clad layers.

BRIEF DESCRIPTION OF THE DRAWINGS

FIG. 2 is a graph showing how the specific resistance of a mixed crystal layer formed on the substrate depends on the mixing rate x at which the mixed crystal is doped with the n-type and p-type impurities;

FIG. 3 is an explanatory view illustrating the construction of a semiconductor laser device according to the first embodiment of the present invention;

FIG. 4 is an explanatory view illustrating the construction of a semiconductor laser device according to the second embodiment of the present invention;

DETAILED DESCRIPTION OF THE PREFERRED EMBODIMENTS

Figure 1:
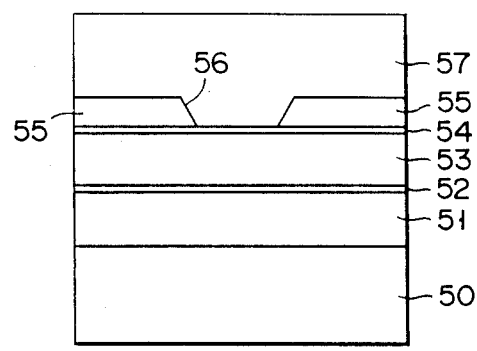
FIG. 1 is an explanatory view illustrating the construction of a conventional semiconductor laser device.

Embodiments of the present invention may now be described, with reference to the accompanying drawings.

FIG. 3 is an explanatory view of the first embodiment of the present invention. In FIG. 3, reference numeral 1 denotes a p-type GaAs substrate. On this GaAs substrate, the following layers are formed by use of the crystal growth process of the MOCVD method: current supply-facilitating layer 2 formed of p-type $In_{0.5}Ga_{0.5}P$; lower clad layer 3 formed of p-type $In_{0.5}(Ga_{0.3}Al_{0.7})_{0.5}P$; undoped activation layer 4 formed of $In_{0.5}Ga_{0.5}P$; upper clad layer 5 formed of n-type $In_{0.5}(Ga_{0.5}Al_{0.5})_{0.5}P$; and current-blocking layer 6 formed of p-type GaAs.

The thicknesses of the respective layers are determined as follows: 0.05 $\mu$m for current supply-facilitating layer 2; 0.5 to 0.8 $\mu$m for lower clad layer 3; 0.08 to 1 $\mu$m for undoped activation layer 4; 1 $\mu$m for upper clad layer 5; and 0.5 $\mu$m for current-blocking layer 6.

Either Si or Se is used as an n-type dopant, and Zn is used as a p-type dopant. By use of these dopants, the carrier concentration of each layer is controlled as follows: $(1\sim2)\times10^{18}$ cm$^{-3}$ for p-type current supply-facilitating layer 2; $(2\sim5)\times10^{17}$ cm$^{-3}$ for p-type lower clad layer 3; $3\times10^{17}$ cm$^{-3}$ for n-type upper clad layer 5; and $(1\sim2)\times10^{18}$ cm$^{-3}$ for p-type current-blocking layer 6.

Inverse-mesa stripe groove 7 is formed in the center of p-type current-blocking layer 6. Stripe groove 7 extends in a direction perpendicular to the direction in which the layers are stacked. By use of the MOCVD method, n-type contact layer 8 is formed on p-type current-blocking layer 6 and also on that surface of upper clad layer 5 which is exposed after the formation of stripe groove 7. Contact layer 8 has a thickness of 1 to 3 $\mu$m and a carrier concentration of $(2\sim5)\times10^{18}$ cm$^{-3}$.

GaAs substrate 1 has a thickness of 80 $\mu$m, and its surface is specularly polished. Ohmic electrodes 9 and 10 are formed on the exposed surfaces of GaAs substrate 1 and n-type contact layer 8, respectively. Ohmic electrode 9 connected to GaAs substrate 1 is formed of Au/Zn, while ohmic electrode 10 connected to n-type contact layer 8 is formed of Au/Ge.

The semiconductor laser device thus fabricated is divided from the wafer state into chips, and each chip is mounted on a heat sink with its ohmic electrode 10.

The semiconductor device of this embodiment differs fundamentally from the conventional semiconductor laser device shown in FIG. 1, in that upper and lower clad layers 3 and 5 are opposite in conductivity type to those of the conventional semiconductor laser device.

It should be also noted that Al-mixing rate of p-type lower clad layer 3 of the embodiment is 0.7, which is higher than the corresponding Al-mixing rate of the semiconductor laser device shown in FIG. 1. As a result of this high Al-mixing rate, the refractive index of p-type lower clad layer 3 is low (see FIG. 5A), so that light is prevented from leaking from activation layer 4. Since, therefore, the clad layer need not be thick, the carrier concentration in the clad layer is low, due to a decrease in the Zn doping efficiency associated with the Al-mixing rate.

Another embodiment of the present invention will be described, with reference to FIG. 4.

In the semiconductor laser device according to the second embodiment, an n-type clad layer is formed in the center of the current-blocking element layer, so as to efficiently confine a current to a limited region.

More specifically, the semiconductor laser device shown in FIG. 4 is similar to that shown in FIG. 3 in that it comprises GaAs substrate 1, p-type current supply-facilitating layer 2, lower clad layer 3, and activation layer 4, but differs therefrom in the following points.

As is shown in FIG. 4, light guide layer 11 of n-type $In_{0.5}(Ga_{0.5}Al_{0.4 \sim 0.5})_{0.5}P$ is formed on activation layer 4. Current-blocking layer 13 of p-type GaAs is formed on light guide layer 11. Stripe groove 20 is formed in the center of current-blocking layer 13. On that surface of light guide layer 11 which is exposed after the formation of stripe groove 20, etching-stop layer 14 and upper clad layer 12 are successively formed in a manner to fill groove 12.

The chemical composition of upper clad layer 12 and that of light guide layer 11 are similar to each other. Etching-stop layer 14 is formed for the purpose of preventing light guide layer 11 from being undesirably etched at the time when upper clad layer 12 is isotropically etched into a predetermined shape. Upper clad layer 12 is formed of n-type $In_{0.5}(Ga_{0.3}Al_{0.7})_{0.5}P$. Etching-stop layer 14 and upper clad layer 12 are formed by use of the MOCVD method, for example.

Current-blocking layer 13 is formed by use of the MOCVD method, using upper clad layer 12 as a mask. As is shown in FIG. 4, therefore, current-blocking layer 13 has a stripe cut-away section with which to expose the upper side of upper clad layer 12. N-type ohmic layer 15 is formed on current-blocking layer 13 and also on the exposed upper side of upper clad layer 12. The carrier concentrations of upper clad layer 12, current-blocking layer 13 and ohmic layer 15 are the same as those of the corresponding layers shown in FIG. 3.

As in the first embodiment shown in FIG. 3, ohmic electrodes 9 and 10 are formed on the exposed surfaces of GaAs substrate 1 and ohmic layer 15, respectively.

In the semiconductor laser device fabricated in the above manner, the total thickness of light guide layer 11, etching-stop layer 14 and upper clad layer 12 is about 1 μm. In other words, the semiconductor laser device is thinner than that shown in FIG. 3. In addition, the current-flowing region is sufficiently confirmed since activation layer 4 is enclosed by current-blocking layer 13. Therefore, the laser device of the second embodiment is of a refractive index waveguide type wherein the transverse mode can be controlled in both the vertical and horizontal directions. Accordingly, the performance of the semiconductor laser device of the second embodiment is superior to that of the semiconductor laser device shown in FIG. 3.

When the semiconductor laser device shown in FIG. 4 is manufactured, p-type GaAs current-blocking 13 is formed by use of Zn. Instead of this dopant, Mg, which provides a slow diffusion speed, may by used for preventing an n-type layer from being inverted by diffusion. Further, the p-type layer may be replaced with a high-resistance layer obtained by ion-implantation of (H protons).

When describing the above embodiment, reference was made only to the InGaAlP grown on the surface of the GaAs substrate. However, the present invention is not limited to this; it may be applied to an InGaAlP-based semiconductor laser device which is formed on a GaAs substrate in a manner to achieve lattice matching therewith under a different condition.

Advantages of the semiconductor laser devices according to the embodiments shown in FIGS. 3 and 4 will be described, while reference to the conventional semiconductor laser device shown in FIG. 1.

Figures 5A, 5B:
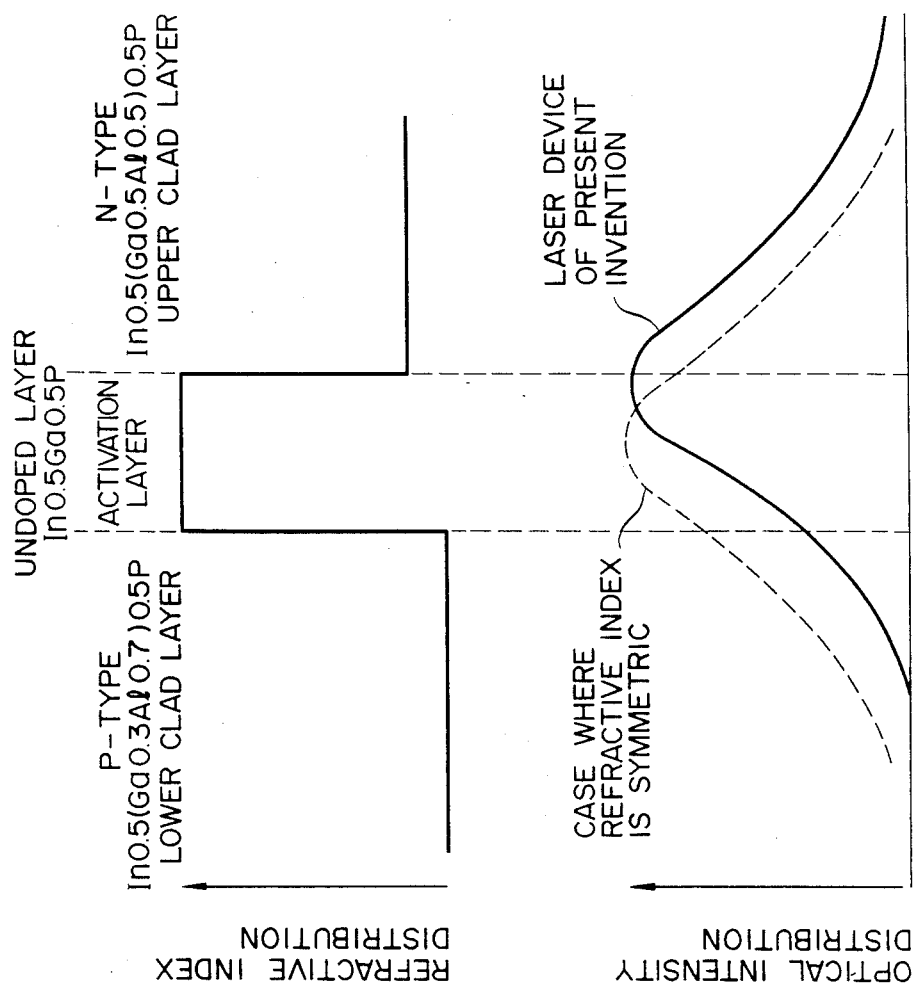
FIG. 5A is a graph showing the distribution of the refractive index of the double hetero junction, with the activation layer and clad layers used as parameters.
FIG. 5B is a graph showing the distribution of the optical intensity of the double hetero junction, with the activation layer and clad layers used as parameters.

FIG. 5A shows the distribution of the refractive index of the double hetero junction in which an activation layer and clad layers sandwiching the activation layer are employed as parameters. Similarly, FIG. 5B shows the distribution of the optical intensity of the double hetero junction in which an activation layer and clad layers sandwiching the activation layer are employed as parameters. In FIGS. 5A and 5B, the characteristics of the semiconductor laser device according to the present invention are indicated with the solid lines, while those of the conventional semiconductor laser device are indicated with the broken lines. In the case of the semiconductor laser device of the present invention, the peak of the optical intensity is depicted as being closer to the region of the "n-type upper clad layer". In the case of the conventional semiconductor layer device, in contrast, the distribution of the refractive index is depicted as being symmetric, and the peak of the optical intensity is depicted as being in the center of the region of the "activation layer".

More specifically, the refractive index distribution shown in FIG. 5A is obtained between the p-type and n-type clad layers and the activation layer by decreasing the mixing rate x of the p-type clad layer relative to the mixing rate x of the n-type clad layer. With such a refractive index distribution, the light generated in the activation layer is guided to the n-type upper clad layer, as is shown in FIG. 5B. This means that the amount of light which may leak to the p-type upper clad layer (which has a comparatively large number of crystal defects) is small in comparison with the case of the conventional semiconductor laser device. Therefore, the optical intensity is not much lowered, as in the case of the conventional semiconductor laser device.

Since the thermal resistance of the n-type clad layer is lower than that of the p-type clad layer, its temperature does not much increase due to the light generated. In addition, since the n-type side is mounted on a heat sink, the semiconductor laser device of the present invention has a satisfactory heat radiating characteristic. As a result, the operating temperature of the semiconductor laser device can be increased.

The above advantages will become more remarkable by increasing the difference between the Al-mixing rate in the n-type clad layer and that in the p-type clad layer. Further, since the thermal resistance of the n-type clad layer will be decreased by decreasing the mixing rate in the n-type clad layer, the temperature characteristics can be improved.

If the mixing rate in the n-type clad layer is decreased, the amount of leakage light will increase, so that the upper clad layer must be thickened. Even if the upper clad layer is thickened, however, an increase in the series resistance will not adversely affect the characteristics of the semiconductor laser device since the specific resistance of the n-type InGaAlP constituting the upper clad layer is sufficiently low, as is shown in FIG. 2. Moreover, since the resistance of the n-type upper clad layer is sufficiently smaller than that of the p-type lower clad layer, the region in which the current flows under the current-blocking layer is dependent on the p-type lower clad layer. It is therefore thought that the thickening of the upper clad layer does not become a problem in practice.

What is claimed is:

1. In a semiconductor laser device, the improvement comprising:
   a substrate formed of elements of III-V groups and being of one conductivity type;
   a lower clad layer formed on said substrate, said lower clad layer being formed of a four-element mixed crystal and being of said one conductivity type; and
   an upper clad layer formed on said lower clad layer, with an activation layer interposed, said upper clad layer being formed of a four-element mixed crystal and being of a conductivity type opposite to said one conductivity type;
   an asymmetric double hetero structure being defined by said upper and lower clad layers wherein said asymmetric double hetero structure is formed by providing each of the upper and lower clad layers with predetermined thermal conductivities.

2. A semiconductor laser device according to claim 1, wherein said asymmetric double hetero structure is formed by providing the upper clad layer with a refractive index larger than that of the lower clad layer.

3. A semiconductor laser device according to claim 1, wherein the four-element mixed crystals of said upper and lower clad layers are InGaAlP.

4. A semiconductor laser device according to claim 3, wherein the four-element mixed crystal of said lower clad layer is $In_{0.5}(Ga_{0.3}Al_{0.7})_{0.5}P$.

5. A semiconductor laser device according to claim 3, wherein the four-element mixed crystal of said upper clad layer is $In_{0.5}(Ga_{0.5}Al_{0.5})_{0.5}P$, and the four-element mixed crystal of said lower clad layer is $In_{0.5}(Ga_{0.3}Al_{0.7})_{0.5}P$.

6. A semiconductor laser device according to claim 1, wherein said substrate, formed of elements of the III-V groups, is of an n-type.

7. A semiconductor laser device according to claim 3, wherein a current supply-facilitating layer is formed between said substrate formed of elements of the III-V groups, and said lower clad layer, said current supply-facilitating layer being formed of InGaP and being of the same conductivity type as that of said lower clad layer.

8. A semiconductor laser device according to claim 3, wherein a current-blocking layer is formed on said upper clad layer except a region for a stripe groove, said current-blocking layer being formed of GaAs and being of a conductivity type opposite to that of said upper clad layer.

9. A semiconductor laser device according to claim 3, wherein said activation layer is formed of undoped InGaP.

10. A semiconductor laser device according to claim 1, wherein said substrate, formed of elements of the III-V groups, is a GaAs substrate.

11. A semiconductor laser device having electrodes and a resonant cavity, comprising:
    a substrate of one conductivity type including elements of groups III-V of the periodic table;
    a lower clad layer of the one conductivity type on the substrate, including a four-element mixed crystal material;
    an activation layer on the lower clad layer; and
    an upper clad layer of another opposite conductivity type on the activation layer, including a four-element mixed crystal material;
    the upper and lower clad layers and the activation layer defining an asymmetric double hetero structure wherein each of the upper and lower clad layers has a predetermined thermal conductivity.

* * * * *

UNITED STATES PATENT AND TRADEMARK OFFICE
CERTIFICATE OF CORRECTION

PATENT NO. :  4,982,409
DATED      :  January 01, 1991
INVENTOR(S):  Hideaki Kinoshita et al It is certified that error appears in the above-identified patent and that said Letters Patent is hereby corrected as shown below:

Column 2, Line 18, change "constant" to --contact--;

Column 5, Line 35, change "12" to --20--;

Column 6, Line 5, before "13" insert --layer--;

Claim 5, Column 8, Line 8, change "$3Al_{0.7})_{0.5}P$" to --$_3Al_{0.7})_{0.5}P$--.

Signed and Sealed this

Twelfth Day of January, 1993

*Attest:*

DOUGLAS B. COMER

*Attesting Officer*    Acting Commissioner of Patents and Trademarks